United States Patent
Anderson et al.

(10) Patent No.: US 6,411,362 B2
(45) Date of Patent: *Jun. 25, 2002

(54) ROTATIONAL MASK SCANNING EXPOSURE METHOD AND APPARATUS

(75) Inventors: Brent Alan Anderson, Jericho; Michael Coffey, Essex Junction, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,072

(22) Filed: Jan. 4, 1999

(51) Int. Cl.[7] .................... G03B 27/48; G03B 27/42; G03B 27/50
(52) U.S. Cl. .................... 355/50; 355/53; 355/49
(58) Field of Search .................... 355/49, 53, 50, 355/67, 71, 77

(56) References Cited

U.S. PATENT DOCUMENTS

| | | | |
|---|---|---|---|
| 3,642,368 A | | 2/1972 | Moss |
| 4,878,086 A | * | 10/1989 | Ishohata et al. ............... 355/77 |
| 5,106,455 A | | 4/1992 | Jacobsen et al. |
| 5,269,882 A | | 12/1993 | Jacobsen |
| 5,395,718 A | | 3/1995 | Jensen et al. |
| 5,591,958 A | * | 1/1997 | Nishi et al. ................... 355/71 |
| 6,018,383 A | * | 1/2000 | Dunn et al. ................... 355/49 |
| 6,031,598 A | * | 2/2000 | Tichenor et al. ............... 355/67 |

* cited by examiner

*Primary Examiner*—Russell Adams
*Assistant Examiner*—Peter B. Kim
(74) *Attorney, Agent, or Firm*—Howard J. Walter, Jr. Esq.; McGinn & Gibb, PLLC

(57) ABSTRACT

A method and rotational mask scanning apparatus for exposing a plurality of images on a workpiece, include a rotatable mask having a pattern of image segments thereon, an optical system for projecting the image segments onto the workpiece, and a device for at least one of rotating the mask and for moving the workpiece so as to continuously expose a plurality of regions on the workpiece with the pattern of image segments.

15 Claims, 3 Drawing Sheets

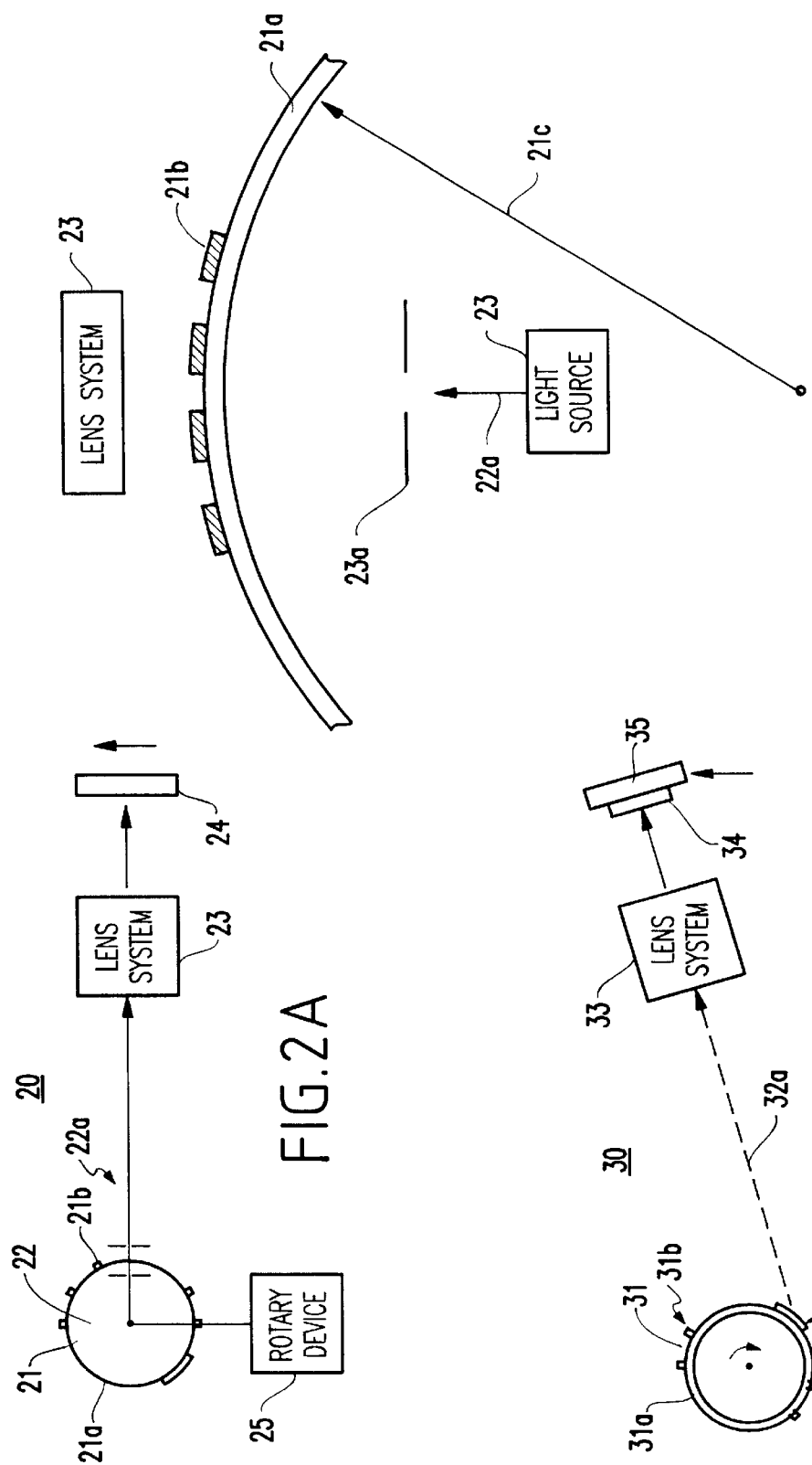

ROTATIONAL MASK SCANNING EXPOSURE METHOD AND APPARATUS

BACKGROUND OF THE INVENTION

1. Field of the Invention

The present invention generally relates to increasing the throughput of scanning lithography systems, and more particularly to a rotational mask scanning method and apparatus for increasing the throughput of such systems.

2. Description of the Related Art

Overlay and image size specifications continue to decrease at a rapid pace driving the migration from traditional step and repeat exposure tools to scanning systems which have improved optical subsystems. However, while the improved optics of the scanning systems may meet the more rigorous specifications, the throughput of these systems is nonoptimal which increases the operation costs.

Conventional translational scanning masks utilize considerable amounts of time stopping and starting. After each field is printed, a reticle of a scanning system must be stopped, repositioned, and accelerated to the selected scanning speed. As a result, considerable mass reduction design constraints are placed on the reticle and reticle stage.

Thus, even though the traditional translational masks utilize very high acceleration/deceleration and scanning speeds to maximize the time spent exposing the wafer, considerable time is still lost in stopping and starting, as mentioned above. As a result, this greatly reduces the throughput of the scanning systems and increases the complexity and cost of the reticle stage.

Furthermore, fundamental throughput limits are being reached due to the increasing percentage of time spent on overhead tasks (e.g., stopping, starting, aligning, etc.) as opposed to time spent exposing the wafer. The conventional systems do not allow for future throughput improvements as wafer stage speed and laser power increases.

SUMMARY OF THE INVENTION

In view of the foregoing and other problems of the conventional methods and systems, an object of the present invention is to provide a structure and method for improving throughput and for simplifying reticle handling.

Yet another object is to provide for continuous scanning across a wafer without having to stop or start the mask or wafer.

A still further object is to optimize efficiency by designing the rotational mask size to match the printed field size.

In a first aspect of the present invention, a photo-exposure tool for exposing a plurality of images on a workpiece, includes a rotatable mask having a pattern of image segments thereon, an optical system for projecting the image segments onto the workpiece, and a device for at least one of rotating the mask and for moving the workpiece so as to continuously expose a plurality of regions on the workpiece with the pattern of image segments.

Thus, with the inventive method and system, throughput is optimized and operation costs are reduced as compared to the conventional methods and systems.

Moreover, the present invention provides a rotational mask which allows for continuous printing of fields without constant starting and stopping. Therefore, higher overall throughput, flexibility in design, and less frequent acceleration/deceleration are achieved.

Furthermore, the inventive structure allows for future throughput improvements as wafer stage speed and laser power increases.

BRIEF DESCRIPTION OF THE DRAWINGS

The foregoing and other objects, aspects and advantages will be better understood from the following detailed description of preferred embodiments of the invention with reference to the drawings, in which:

FIGS. 2A–2C are schematic diagrams of an optical system (e.g., a scanning exposure system) according to a first preferred embodiment of the present invention; and FIGS. 3A–3C are schematic diagrams of an optical system (e.g., a scanning exposure system) according to a second preferred embodiment of the present invention.

DETAILED DESCRIPTION OF PREFERRED EMBODIMENTS OF THE INVENTION

Figure 1:
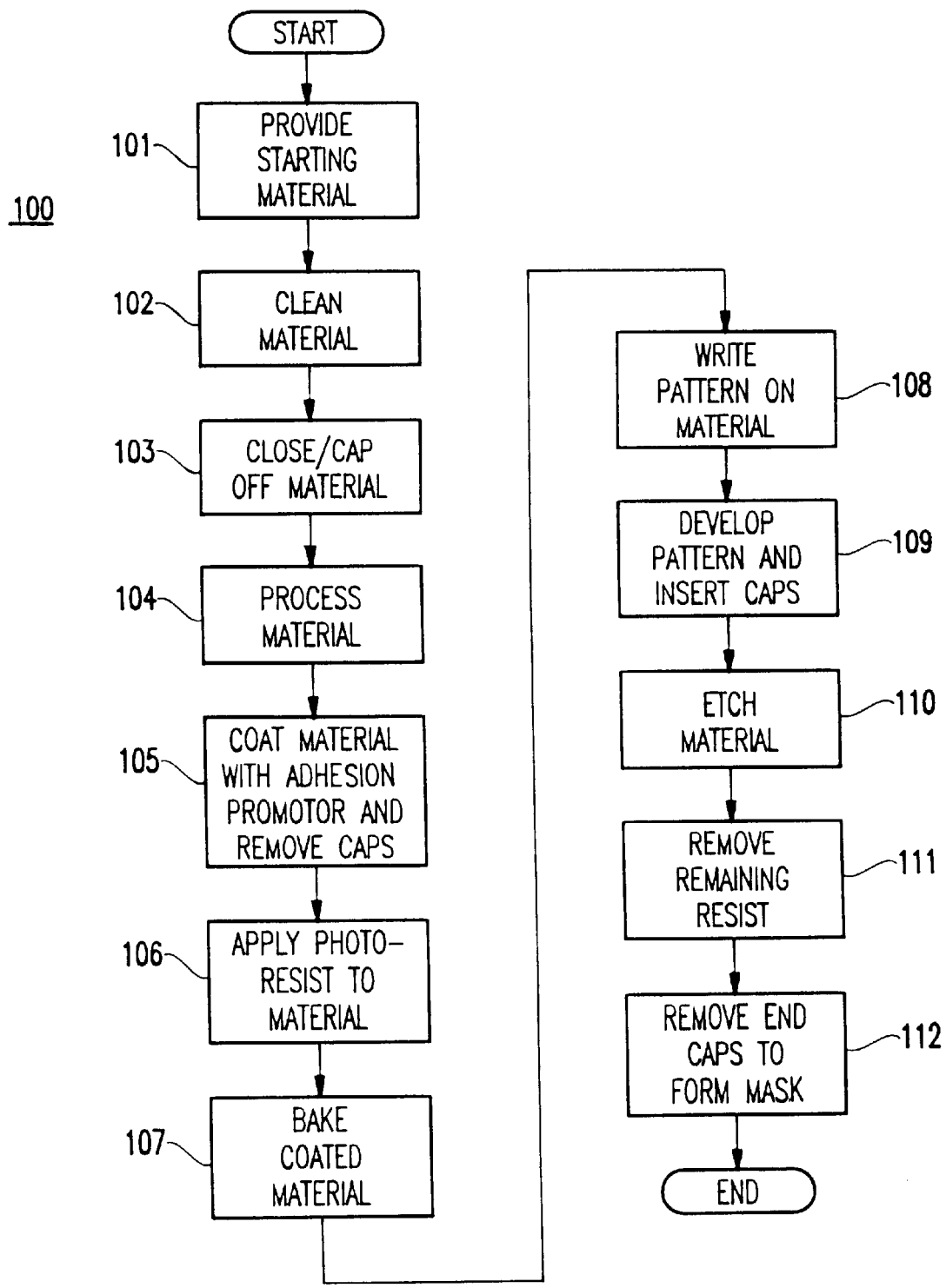
FIG. 1 is a flow diagram illustrating a preferred method of forming a mask according to the present invention.

Referring now to the drawings, and more particularly to FIGS. 1–3B, preferred embodiments of the present invention will be described hereafter.

Generally, in a first preferred embodiment, a rotational mask is employed in a scanning exposure tool to improve throughput and simplify reticle handling. Maximum efficiency can be achieved by designing the rotational mask size to match the printed field size, thereby allowing for continuous scanning across the wafer without needing to stop or start the mask or wafer. Fields are printed one after the other in a row. Printing in the opposite direction requires that the rotational direction of the mask be reversed. If rows are printed in only one scan direction, then the mask rotation can remain constant.

A second preferred embodiment allows the mask circumference to be larger than the printed field size. In this approach, fields are not printed continuously. At the completion of each field, the reticle and wafer stage must be repositioned to the following field by acceleration/deceleration of one or both components.

Process of Forming Mask

Prior to examining the preferred system structures, an illustrative process 100 for constructing a cylindrical mask for an optical system (e.g., a scanning exposure system) is described herein below and by referring to FIG. 1. The mask is preferably cylindrical or part of a cylinder. For example, the mask could be formed as a segment portion of a cylinder. For maximum efficiency, the mask should be curved.

First, as shown in step 101, a starting material is provided. For example, a polished cylinder may be provided, made of at least one of quartz, silica or another material transparent at the exposing wavelength (e.g., the wavelength of a light source employed). Some exemplary cylindrical dimensions include a radius of within the range of about 10 mm to about 100 mm, and preferably about 25 mm, a thickness substantially within a range of about 2 mm to about 10 mm, and preferably about 6 mm, and a length substantially within a range of about 20 mm to about 300 mm, and more preferably about 200 mm. The dimensions (especially width and length) of the mask are selected to optimize a scanning exposure of a selected workpiece. Obviously, the mask's dimensions may be selectively changed.

Thereafter, the processing of the starting material begins.

As shown in step 102, the cylinder is cleaned preferably using a solvent such as, for example, acetone, two-proponal or aqueous solutions of hydrogen peroxide and water, sulfuric acid/hydrogen peroxide mix, and the like. Other cleaning methods also can be employed, as are known in the art, such as sputter cleaning with an inert gas such as argon, or plasma "ashing" with oxygen or ultraviolet (UV) "ashing" with ozone.

Then, as shown in step 103, the ends of the cylinder are enclosed or capped with a material that is insensitive to subsequent processing. For example, candidate capping materials may include quartz, Teflon, or other rigid or semirigid materials that can be used in a vacuum and are resistant to wet chemicals such as solvents, acids, oxidizers, or bases.

Thereafter, as shown in step 104, the cylinder is processed depending upon the type of mask to be formed.

For example, for a reflective-type mask, the cylinder is preferably solid and made of a material that can be polished to optical flatness.

If a transparent material is used as the underlying substrate, the transparent material must first be coated with a thin film that will reflect the wavelength of the incoming light source. Candidate materials for the reflective thin film to be coated on the transparent material include at least one of chrome, gold, aluminum, refractory metals, metal alloys or nitrides of refractory metals, and the like, all of which can be deposited using conventional application techniques including chemical-vapor deposition (CVD), sputter deposition, dip coating, or plating. Preferably, the thickness of the thin film coating deposited on a transparent substrate is substantially within a range of about 500 to about 2000 Angstroms, and more preferably about 1000 Angstroms. More generally, the coating is preferably thick enough to be uniformly reflective and defect-free (e.g., pinholes, etc.).

For a transmission-type of cylindrical mask, the outer surface of the cylinder is coated with an opaque or semi-transparent material such as at least one of gold, chrome, tungsten, titanium, tantalum, and other refractory materials, alloys thereof, as well as nitrides of tungsten, titanium, tantalum and other refractory metals. The coating is performed using conventional application techniques including chemical-vapor deposition (CVD), sputter deposition, reactive sputter deposition, dip coating or plating.

Additionally, compound or multi-layer materials can be used to control reflections within the starting material substrate. For example, a plurality of layers may be formed such as a titanium layer on top of a titanium nitride layer which in turn is formed on a surface of the substrate. The thickness of the individual coating(s) preferably may be substantially in a range of about 500 to about 2000 Angstroms each.

For a reflective-type mask, the entire outer surface of the cylinder (e.g., preferably only the surface to be rotated and opposed to the workpiece) is coated with a material that will absorb the incoming wavelength. For example, such a material may include at least one of an anti-reflective chrome, silicon, carbon, nitrides of refractory metals such as titanium nitride, and such a material may be deposited by similar methods described above (e.g., CVD, sputtering, plating, reactive sputtering, etc.).

In some cases, the layer will absorb at a particular thickness and is related to the refractive index of the deposited material and the wavelength of the incident light. For example, silicon thicker than 2000 Angstroms will absorb UV light having a wavelength of 248 nm. Other thin, transparent films will appear opaque at a given thickness due to their refractive index and the wavelength of the incident light.

In preparation for patterning the opaque, semi-transparent, or absorbing material, in step 105, the cylinder is coated with an adhesion promoter such as hexamethyldisilazane (HMDS), which is commonly-available.

For vacuum integrity, the end caps or enclosure are preferably removed at this point.

Then, in step 106, an electron-beam sensitive photoresist (e.g., polybutylsulphone (PBS)) is applied to the outer periphery of the cylinder by conventional techniques such as roller-coating, spin-coating, or spray-coating.

As shown in step 107 of FIG. 1, in preparation for electron-beam (e.g., ebeam) exposure, the coated cylinder is baked in a convection oven for approximately 30 minutes at a temperature preferably substantially in a range of about 120° C. to about 150° C., and more preferably at about 130° C.

Then, in step 108, the cylinder is exposed using an electron-beam tool which "writes" the desired pattern in the e-beam resist (e.g., see U.S. Pat. No. 5,269,882, incorporated herein by reference, which describes a method and process for writing a pattern on a resist coated cylinder).

Thereafter, the end caps are preferably placed back on the cylinder during the wet and/or dry processing.

Then, as shown in step 109, the pattern on the cylinder is developed, thereby removing the resist from areas that were not exposed by the e-beam tool. The cylinder is again baked in a conventional oven for about 30 minutes at about 150° C., for example.

Then, in step 110, the cylinder is etched by exposing the cylinder to an appropriate etching agent. For example, the agent may be a wet chemical such as an acid or a base that preferentially etches the opaque material (e.g., chrome) not covered by the e-beam resist. Alternatively, the agent may be a dry process material such as a plasma etch, thereby to preferentially etch the areas for the cylinder that are not covered by the e-beam resist.

Thereafter, in step 111, the remaining e-beam resist is removed from the cylinder using an appropriate wet or dry process. For example, a wet process could be a sulfuric acid/hydrogen peroxide mixture which removes the e-beam resist oxygen-rich plasma.

Then, in step 112, preferably the end caps are removed, and the mask (e.g., cylinder) is completed and now ready for use in the exposure tool. The exposure tool may be a scanning exposure system using a rotational mask, as described below and as shown in FIGS. 2A–3C.

First Preferred Embodiment

Referring to FIGS. 2A–2B, a scanning exposure system 20 is shown which incorporates a rotational mask as built by the exemplary and non-limiting process above. The rotational mask preferably is a transmission mask having a transparent surface such that the light is illuminated from within the mask along opaque images formed on the surface of the mask.

As shown in FIG. 2A, the system 20 includes a rotational mask 21 having a substrate 21a on which a plurality of opaque images (e.g., patterns) 21b are formed on the mask's outer periphery. Additionally or alternatively, a plurality of interference patterns may be formed on the surface of the mask. A light source 22 is preferably formed such that light is emitted through the rotational mask. For example, the light source could be formed in the interior of the mask, thereby forming an illumination system. The illumination system also could include a variety of other systems. Alternatively, the light source could be formed external to the mask with suitable light reflecting means, such as reflecting mirrors and the like. With such an external light source using the reflecting mirrors, the light beam may be brought into the mask and reflected through the mask.

The rotational mask 21 may be a large cylinder or a small cylinder of any practical length and radius depending upon the size of the image to be formed on the object. There is no fundamental limit to the size of the mask. Further, as mentioned above, the mask can be a segment (portion) of a cylinder.

The mask 21 modulates light 22a output by the light source 22. The light may be modulated by any type of light modulator such as a slit, a pin-hole, an iris, a shutter, etc. The modulated light 22a is input to a lens system 23.

The lens system 23 may be a reduction lens system to image fine/small patterns on the object to be imaged. Alternatively, the lens system can be a magnifying system which magnifies the image for a particular application if desired. The lens system 23 may be a single lens or a plurality of lenses depending upon the designer's application, constraints and design requirements. The same lens system can be used as in the first embodiment. The object 24 (workpiece) to be imaged receives the light from the lens system 23.

The rotational mask 21 is rotated by a rotary device 25. Device 25 includes conventional means well known in the art, such as a high accuracy and precision stepping motor.

FIG. 2B illustrates a cross-section of mask 21 (e.g., preferably a cylindrical mask) formed having the transparent substrate 21a. A series of opaque patterns 21b are formed on the substrate 21a, thereby to form an image on the object 24 to be imaged. As discussed above in the first embodiment, the light source 23 may be built into the mask, or alternatively the light source is preferably external to the mask and a reflecting mirror or the like can be used to input light to the transparent mask and the then the light is reflected through the transparent mask. Typically, just the outer periphery of the mask with the opaque patterns rotate. The light source may be equipped with a light modulator 23a such as a slit, pin-hole, an iris, etc. The mask has a radius 21c which may be within a range substantially between about 10 mm and about 100 mm, depending upon the application.

In the first preferred embodiment, the rotational mask employed in the scanning exposure tool improves throughput and simplifies reticle handling. By designing the rotational mask size to match the printed field size (e.g., printed on the object to be imaged), continuous scanning across the wafer can be achieved without needing to stop or start the mask or wafer. Fields are printed one after the other in a row. The workpiece is moved continuously, and the source does not move. Printing in the opposite direction requires that the rotational direction of the mask be reversed. If rows are printed in only one scan direction, then the mask rotation can remain constant.

With the scanning system shown in FIGS. 2A–2B including a rotational mask 21, continuous printing of fields is made possible without constant starting and stopping of the mask and wafer. Therefore, higher overall throughput, flexibility in design, and less frequent acceleration/deceleration are achieved.

Another advantage is that repeating images can be printed without a seam. For example, for liquid crystal displays (LCDs) today, many images are printed together to make one display. That is, a field size of the LCD is smaller than the overall LCD display. Thus, a plurality of images (or image portions) must be formed and "assembled" together to form the overall image. However, the position where the images (or image portions) overlap creates problems. Such problems do not arise with the present invention since no seam is present, even when repeating images are printed. Many applications would find great benefit from this feature, including, for example, the printing of repetitive fabric patterns, etc.

Further, in LCD displays, scans can be performed a plurality of times (e.g., two or more) with many revolutions per scan. Thus, multiple rotations may be formed by rotating the rotational mask a plurality of time (e.g., past 360 degrees). Hence, the invention is capable of printing beyond 360 degrees.

Second Preferred Embodiment

Figure 3C:
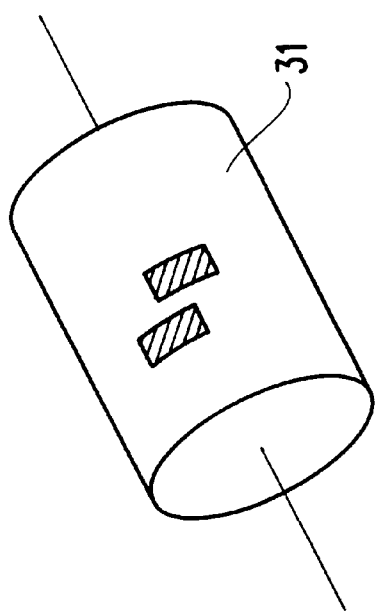
Figure 3B:
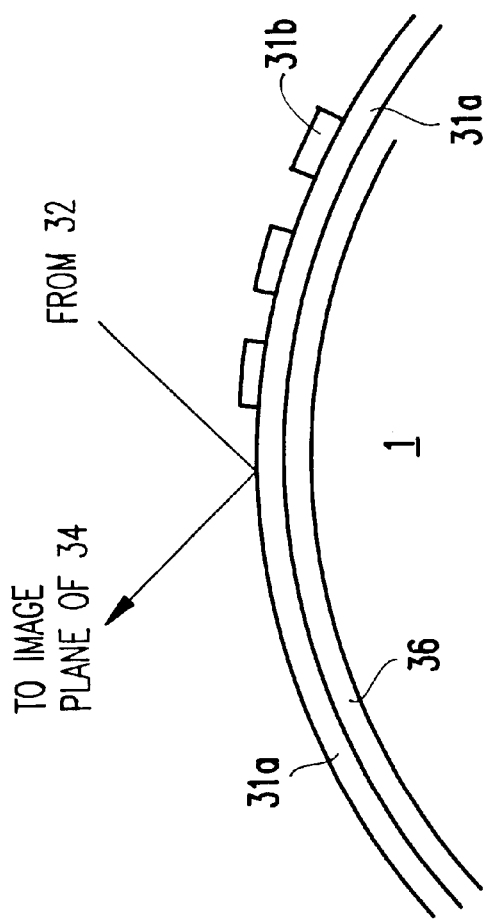

Turning to FIGS. 3A–3C, a second preferred embodiment of the scanning system 30 is shown which includes a reflective, rotational mask 31. The system 30 is substantially similar to the first embodiment shown in FIGS. 2A–2C but for the reflective mask 31 and using an external light source 32.

As shown in FIG. 3A, the mask is preferably cylindrical and includes a reflective layer 31a formed on its outer periphery. Further, the mask 31 includes opaque image 31b on top of the reflective surface. A light source/illuminator 32 is shown external to the mask 32, thereby forming an illumination system. The illumination system could be a variety of systems (e.g. optical, e-beam, x-ray, etc.)

The rotational mask 31 is rotated by conventional means well known in the art and as described above as rotary device 25. The rotational mask 32 may be a large cylinder or a small cylinder of any practical length and radius depending upon the size of the image to be formed on the object. Preferably, the size of the area on the object to be imaged substantially corresponds to the size of the rotational mask.

The mask 31 modulates light 32a output by the light source 32. Specifically, the light is modulated by the opaque portions and/or interference patterns formed on the mask 32. As before in the first embodiment, the modulated light 32a is input to a lens system 33.

The lens system 33 may be as above with the first embodiment, and may be a reduction lens system to image fine/small patterns on the object to be imaged. Alternatively, the lens system can be a magnifying system which magnifies the image for a particular application if desired. The lens system 33 may be a single lens or a plurality of lenses depending upon the designer's application, constraints and design requirements. The same lens system can be used for the second embodiment as in the first embodiment. The object 34 (workpiece) to be imaged may be mounted on a stage 35 for easy and precise positioning and handling of the object 34. A stage also may be used in the first embodiment. Generally, the stage is a standard component known in the art, and the stage can be designed for lower cost and higher throughput of the system.

FIG. 3B illustrates a cross-section of mask 31 (e.g., preferably a cylindrical mask) formed having a substrate 36 having a reflective layer 31a formed thereon. A series of opaque patterns 31b are formed on the reflective layer 31a, thereby to form an image on an object to be imaged.

FIG. 3C illustrates a perspective view of the cylindrical mask 31. As shown in FIG. 3B, the mask 31 includes a plurality (e.g., two in the exemplary arrangement of FIG. 3 C) of opaque patterns on a field of reflective material 31a.

With the scanning system shown in FIGS. 3A–3B including a rotational mask 31, continuous printing of fields is made possible without constant starting and stopping. Therefore, higher overall throughput, flexibility in design, and less frequent acceleration/deceleration are achieved.

Hence, the second embodiment has the same capabilities as the first embodiment, and can print continuous or sequential images.

Furthermore, utilizing existing illumination sources and wafer stages, there is a significant improvement in throughput of the system. Another advantage is that this design obtains significant benefit by any increase in laser power or stage velocity, whereas existing, flat mask systems obtain minimal benefit. Instead, the flat masks must rely on a much more expensive implementation to increase acceleration/deceleration of wafer and reticle stages.

While the invention has been described in terms of preferred embodiments, those skilled in the art will recognize that the invention can be practiced with modification within the spirit and scope of the appended claims As would be appreciated by one of ordinary skill in the art within the purview of the present application, the present invention has applications other semiconductor wafer imaging. For example, the invention would find great benefit in applications and areas where repetitive images are printed at very high resolution. Computer card printing and liquid crystal display (LCD) devices are but two examples.

What is claimed is:

1. A photo-exposure tool for exposing a plurality of images on a rigid workpiece, comprising:

a rotatable mask having a cylindrical shape and a pattern of image segments thereon;

an optical system for projecting the image segments onto the rigid workpiece, said optical system including a lens external to said rotatable mask; and means for selectively rotating said mask and for translating the rigid workpiece so as to continuously expose a plurality of regions on the rigid workpiece with said pattern of image segments, such that said mask is selectively rotated while said workpiece is selectively translated, said rotating by said rotating means being performed during exposure of said workpiece, wherein translation of said workpiece is synchronized with said rotating by said rotating means.

2. The tool according to claim 1, wherein said images comprise identical images.

3. The tool according to claim 1, wherein said mask includes a substrate, and wherein said pattern comprises a plurality of opaque portions formed on said substrate.

4. The tool according to claim 1, wherein said optical system comprises a light source for transmitting a light beam through said mask.

5. The tool according to claim 1, wherein said optical system comprises a light source for producing a light beam reflected from said mask.

6. The tool according to claim 1, wherein said workpiece is flat.

7. The tool according to claim 1, wherein said mask is rotated in synchronization with translation of the workpiece.

8. A scanning exposure tool for producing images on a rigid object having a photoimageable film thereon, comprising:

a light source for producing a light beam;

a rotating mask having a cylindrical shape and the light beam transmitted therethrough; and a lens system for receiving said light beam form said mask, said lens system including a lens external to said rotating mask, wherein said light source is modulated by said rotating mask and projected through said lens system to the rigid object, wherein said rotating mask rotates during exposure of said rigid object, wherein translation of said rigid object is synchronized with rotation of said rotating mask such that said mask is selectively rotated while said rigid object is selectively translated so as to continuously expose a plurality of regions on said rigid object with said images.

9. The tool according to claim 8, wherein said mask includes a substrate, and includes a pattern comprising at least one of a plurality of opaque portions and a plurality of interference portions formed on said substrate.

10. The tool according to claim 8, wherein said object is flat.

11. The tool according to claim 8, wherein said mask is rotated in synchronization with translation of the object.

12. A scanning exposure system for producing an image on a rigid object having a photoimageable film thereon, comprising:

a rotating mask having a cylindrical shape and a thin film reflective coating and at least one of an opaque image and an interference pattern formed on the reflective coating;

a light source for directing light to said mask, said mask reflecting the light to produce reflected light; and a lens system for receiving the reflected light from said mask, said lens system including a lens external to said rotating mask, wherein said rotating mask rotates during exposure of said rigid object, wherein said mask is rotated in synchronization with translation of the object such that said mask is selectively rotated while said rigid object is selectively translated so as to continuously expose a plurality of regions on said rigid object with segments of said image.

13. The system according to claim 12, wherein the light directed from said light source to said mask is modulated by the at least one of the opaque image and the interference pattern and the reflective coating of the mask, and is projected through said lens system to the object.

14. The system according to claim 13, wherein said mask includes a substrate, and a pattern of image segments formed thereon, and wherein said pattern comprises the at least one of the opaque image and the interference pattern formed on said substrate.

15. The system according to claim 12, wherein said object is flat.

* * * * *